(12) United States Patent
Van den Bersselaar

(10) Patent No.: US 9,357,640 B2
(45) Date of Patent: May 31, 2016

(54) METHOD OF MANUFACTURING A MULTI-LAYER PRINTED CIRCUIT BOARD

(71) Applicant: Océ-Technologies B.V., Venlo (NL)

(72) Inventor: Hendrikus J. T. M. Van den Bersselaar, Venlo (NL)

(73) Assignee: OCÉ'-TECHNOLOGIES B.V., Venlo (NL)

( * ) Notice: Subject to any disclaimer, the term of this patent is extended or adjusted under 35 U.S.C. 154(b) by 0 days.

(21) Appl. No.: 14/853,125

(22) Filed: Sep. 14, 2015

(65) Prior Publication Data

US 2016/0088741 A1 Mar. 24, 2016

(30) Foreign Application Priority Data

Sep. 22, 2014 (EP) .................... 14185748

(51) Int. Cl.
| | |
|---|---|
| H05K 3/00 | (2006.01) |
| H05K 1/03 | (2006.01) |
| H05K 3/46 | (2006.01) |
| H05K 3/06 | (2006.01) |
| H05K 1/02 | (2006.01) |
| H05K 3/38 | (2006.01) |

(52) U.S. Cl.
CPC ................ *H05K 1/03* (2013.01); *H05K 1/0298* (2013.01); *H05K 3/0085* (2013.01); *H05K 3/061* (2013.01); *H05K 3/38* (2013.01); *H05K 3/462* (2013.01); *H05K 3/4644* (2013.01); *H05K 2201/0367* (2013.01); *H05K 2201/09881* (2013.01); *H05K 2203/013* (2013.01)

(58) Field of Classification Search
CPC ....... H05K 1/03; H05K 1/0313; H05K 1/032; H05K 3/0085
See application file for complete search history.

(56) References Cited

U.S. PATENT DOCUMENTS

| | | | |
|---|---|---|---|
| 7,285,305 B2 | 10/2007 | Furusawa et al. | |
| 7,713,862 B2 | 5/2010 | Cho et al. | |
| 2005/0121225 A1 | 6/2005 | Hsu | |
| 2007/0169960 A1 | 7/2007 | Hayashi | |
| 2008/0115961 A1 | 5/2008 | Mok et al. | |

FOREIGN PATENT DOCUMENTS

| | | |
|---|---|---|
| EP | 0 062 084 A1 | 10/1982 |
| EP | 0 851 724 A2 | 7/1998 |
| WO | WO 2013/103298 A1 | 7/2013 |

*Primary Examiner* — Jeremy C Norris
(74) *Attorney, Agent, or Firm* — Birch, Stewart, Kolasch & Birch, LLP

(57) ABSTRACT

A method of manufacturing a multi-layer printed circuit board by bonding together a plurality of circuit board layers, each of which includes a substrate and a conductive circuit pattern on at least one surface of the substrate, includes the steps of: coating the surface of the substrate with a continuous layer of conductive material, masking the layer with a resist, etching away a part of the conductive material so as to obtain the circuit pattern with conductive parts separated by gaps, and filling the gaps with an electrically insulating adhesive material to a level that is at least equal to the thickness of the layer of conductive material. The resist is left on the conductive parts and the adhesive material is selected to be chemically compatible with the resist.

10 Claims, 3 Drawing Sheets

METHOD OF MANUFACTURING A MULTI-LAYER PRINTED CIRCUIT BOARD

METHOD OF MANUFACTURING A MULTI-LAYER PRINTED CIRCUIT BOARD

The invention relates to a method of manufacturing a multi-layer printed circuit board by bonding together a plurality of circuit board layers each of which includes a substrate and a conductive circuit pattern on at least one surface of the substrate, the method comprising the steps of:
coating the surface of the substrate with a continuous layer of conductive material,
masking the layer with a resist,
etching away a part of the conductive material so as to obtain the circuit pattern with conductive parts separated by gaps and
filling the gaps with an electrically insulating adhesive material to a level that is at least equal to the thickness of the layer of conductive material.

A manufacturing method of this type has been described in US 2005/121225 A1.

WO 2013103298 A1 describes a manufacturing method wherein ink jet printing technologies are used for masking the conductive layer. After etching, the resist is stripped off, and several layers each of which consists of a substrate and at least one circuit pattern are laminated one upon the other, with films of fibre-reinforced epoxy resin intervening between the adjacent layers. These films serve as bonding layers, so that the multiple layers can be bonded together by applying heat and pressure.

U.S. Pat. No. 7,713,862 B2 and U.S. Pat. No. 7,285,305 B2 disclose manufacturing methods, in which ink jet printing technology is also used for directly printing the conductive circuit patterns, and the multi-layer board is built up step by step by successively forming insulating layers at circuit patterns one upon the other.

It is an object of the invention to provide a method of the first-mentioned type which permits to produce multi-layer printed circuit boards with improved quality and yield.

According to the invention, in order to achieve this object, the resist is left on the conductive parts and the adhesive material is selected to be chemically compatible with the resist.

This method has the advantage that the conductive material of the circuit pattern and the adhesive material in the gaps, together, can form a flat surface, which permits to bond the various layers together more reliably and without warping. In particular, each layer will have a constant thickness, regardless of local variations in the distribution of conductive parts and gap. For example, when, in a plurality of layers, each layer has densely packed conductive tracks with only narrow gaps therebetween on one side and only very few conductive tracks with large gaps therebetween on the other side, each layer will nevertheless have a uniform thickness on its entire area, so that no warps will be caused by thickness variations that accumulate over the thickness of the stack. As another advantage, it is not necessary to strip off the resist after the etching step.

Another advantage is that, as the adhesive material is electrically insulating, it will reliably insulate adjacent conductive tracks from one another, even when the gap between the tracks is very narrow and even when pressure is applied in the bonding step and the conductive material of the tracks is squeezed and forced to spread in width direction, with the result that the gaps between the tracks become even narrower.

More specific optional features of the invention are indicated in the dependent claims.

The adhesive material filling the gaps may form part of the surface of the circuit board layer and may directly constitute the bonding layer that is used for bonding the various circuit board layers together. As an alternative, an additional bonding layer may be provided to cover the conductive tracks and also the adhesive material in the gaps. In this case, the adhesive material in the gap will bond to the bonding layer on the one side and to the substrate on the other side, so that the various circuit board layers can be held together with high bonding strength.

The resist may be covered with a thin layer of the adhesive material so as to form a continuous bonding layer. As an alternative, the resist may have adhesive properties itself, so that the gaps may be filled with the insulating adhesive material to the level of the top surface of the resist, and the resist and the insulating adhesive material, together, will form the bonding layer. In a specific embodiment, the material forming the resist may be identical with the material filling the gaps.

In another embodiment, the resist and the material filling the gaps may constitute adhesive components that undergo a chemical reaction with one another in the bonding process. Similarly, when the substrates of the circuit board layers carry conductive patterns on both sides, the material forming the bonding layer between the two circuit board layers may be constituted by a two-component system, with one component forming the surface of one of the circuit board layers and the other component forming the surface of the other circuit board layer. In the bonding process, the two components will react with one another to form the bond.

Similarly as the resist, the material filling the gaps may be applied onto the substrate by means of a printing technique such as ink jet printing or electrostatic printing.

The invention also discloses a multi-layer printed circuit board that is obtained by the process described above.

Embodiment examples will now be described in conjunction with the drawings, wherein.

Figure 1:
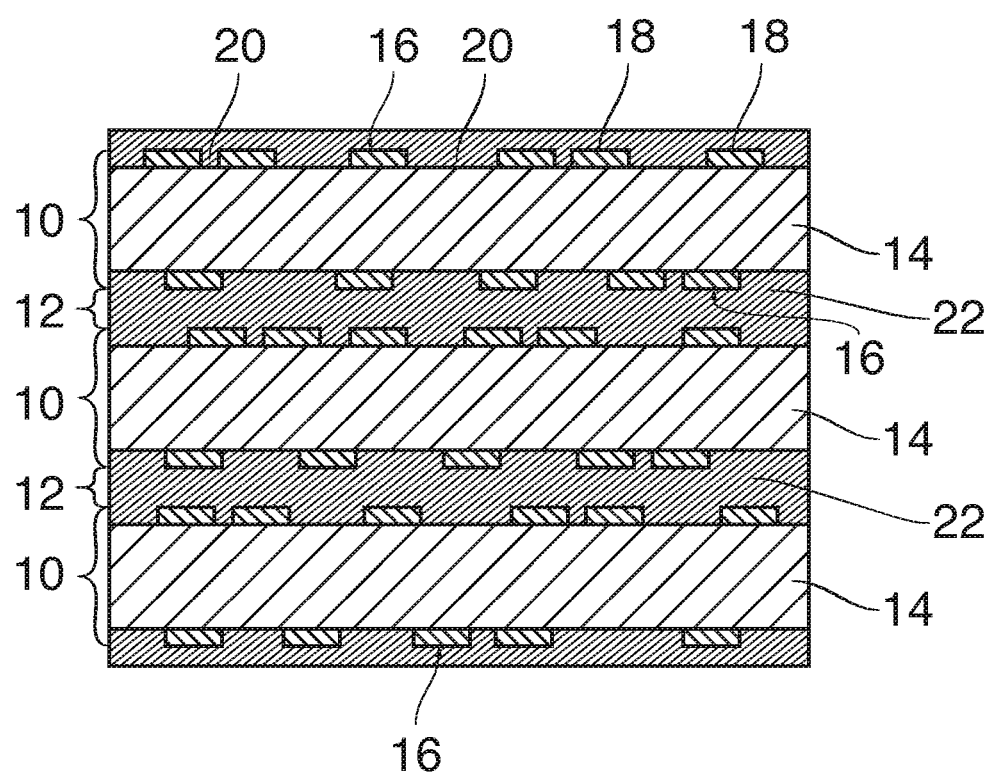
FIG. 1 is a schematic cross-sectional view of a multi-layer printed circuit board obtained by a method according to the invention.

FIG. 1 illustrates an example of a multi-layer printed circuit board having three circuit board layers 10 with bonding layers 12 intervening therebetween. Each circuit board layer 10 comprises a substrate 14 that may be formed for example by a glass fibre-reinforced epoxy resin and carries an electrically conductive circuit pattern 16 on both its main surfaces, Each circuit pattern 16 comprises a number of conductive parts 18, e.g. in the form of tracks, that are separated by smaller or wider gaps 20.

The gaps 20 are filled with an electrically insulating adhesive material that, in this example, is identical with the material of the bonding layers 12. In the bonded state shown in FIG. 1, the material filing the gaps of the conductive patterns 16 of two adjacent layers 10 is merged with the bonding layer 12 that is arranged between these two circuit board layers 10, so that the material filling the gaps and the material of the bonding layer 12 form a one-piece body 22 that bonds the two layers together and electrically insulates their circuit patterns from one another.

FIGS. 2 to 6 illustrate a sequence of steps for preparing one of the circuit board layers 10 shown in FIG. 1.

Figure 2:
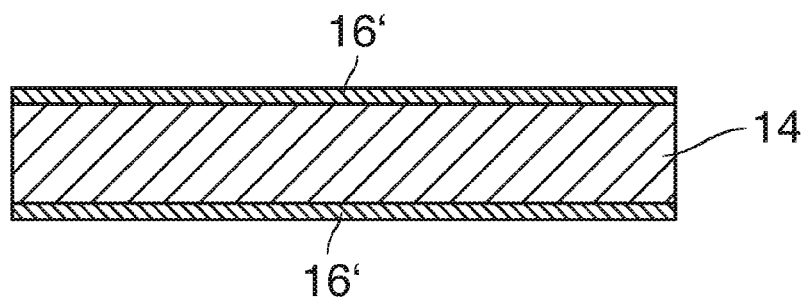
FIGS. 2 to 6 are sectional view illustrating successive steps of a manufacturing method according to a first embodiment of the invention.
Figure 3:
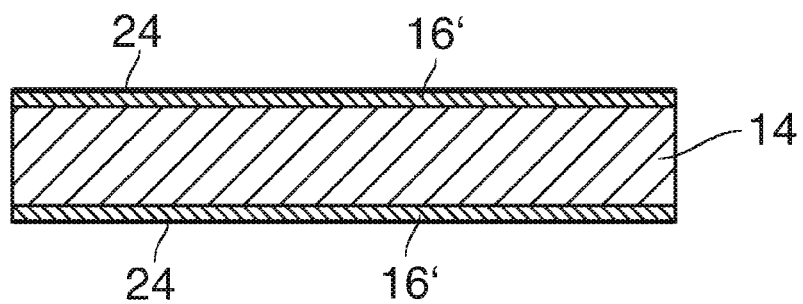
Figure 4:
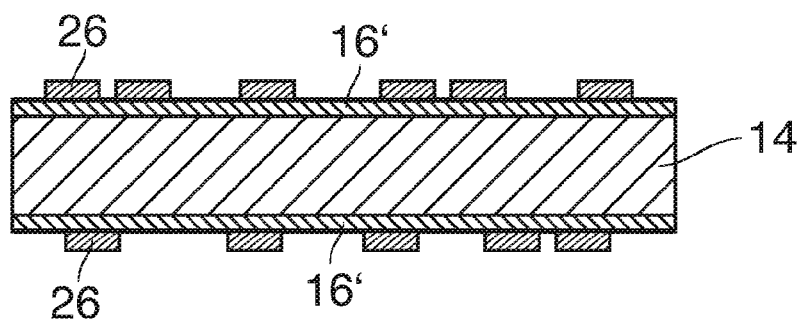

As is shown in FIG. 2, the plate-like substrate 14 is coated with a continuous layer of electrically conductive material 16' on both sides. Then, as is shown in FIG. 3, the conductive material 16' is subjected to a physical and/or chemical treatment such as pre-etching, for obtaining a surface 24 that assures good adhesion of a resist 26 that is applied in a subsequent step, as shown in FIG. 4.

Figure 5:
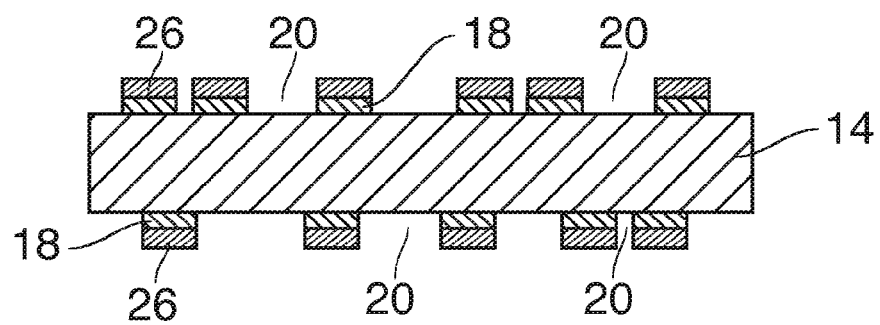

The resist 26 is applied in a pattern that corresponds to the desired circuit pattern 16 shown in FIG. 1 and masks the conductive material 16' in those areas where the conductive parts 18 (FIG. 1) shall be formed. A printing technique such as electrostatic printing or ink jet printing may be used for applying the resist 26, as is known in the art. Then, the parts of the conductive material 16' that are not covered by the resist 26 are etched away. The result is shown in FIG. 5. What is left of the conductive material 16' forms the conductive parts 18, each of which is still covered with the resist 26. Thus, the gaps 20 are formed between the conductive tracks.

Figure 6:
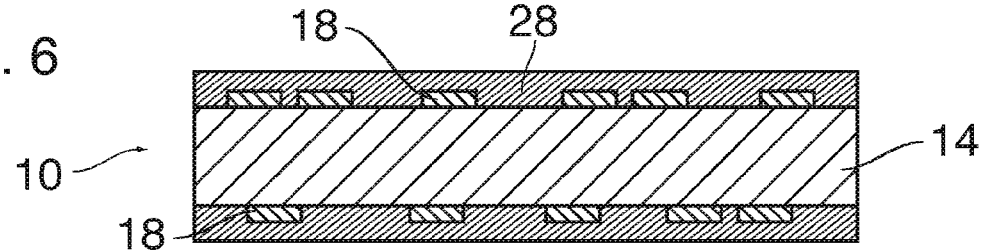

Then, as is shown in FIG. 6, the circuit board layer 10 is completed by filling the gaps 20 with an electrically insulating adhesive material 28 which, in the present example, is identical with the material of the resist 26. In this example, the gaps 20 are filled up to a level that corresponds to the combined thicknesses of the conductive parts 18 (former thickness of the layer of conductive material 16') and the resist 26, and the material filling the gaps 20 merges with the resist to form a continuous flat surface that extends over the entire area of the layer 10.

Finally, a plurality of such layers 10, generally with different circuit patterns 16, are stacked one upon another and bonded by applying heat and/or pressure, so that the layers of adhesive material 28 of adjacent circuit board layers 10 are merged with one another and are cured to form the one-piece bodies 22 shown in FIG. 1.

The adhesive material 28 may be applied in the form of droplets by means of ink jet printing. In order to obtain the required layer thickness in the regions of the gaps 20, the drop size of the ink jet printer may be adjusted appropriately, or the adhesive material 28 may be applied in two or more layers in subsequent printing steps.

In a modified embodiment, the adhesive material 28 may be applied by means of another printing technique such as electrostatic printing. In this case, the adhesive material 28 will originally be a solid state, in the form of fine particles comparable to toner particles for electrostatic printing. The particle size may be adjusted to obtain the appropriate layer thickness. A fusing step in which the particles are fused to form a continuous solid layer may in this case be combined with the bonding step in which heat and pressure are applied, anyway.

The examples that have been described above may be modified in various ways.

For example, in the step shown in FIG. 6, the adhesive material 28 may be applied not only in the gaps 20 but also in the form of a thin layer covering the resist 26 that was already present on the conductive parts 18.

The adhesive material 28 may also be different from the material forming the resist 26, provided that these materials are chemically compatible with one another in the sense that they can be merged to form a one-piece body by fusing, sintering or chemical reaction.

In another embodiment, starting from the condition shown in FIG. 5, the resist 26 may be removed before the adhesive material 28 is applied. Then, the adhesive material 28 may cover the conductive parts 18 in a thin layer so as to obtain a continuous bonding layer. I this case, of course, the adhesive material 28 needs not to be compatible with the resist 26.

As another alternative, the gaps 20 may be filled with the adhesive material 28 only to the level that corresponds to the thickness of the conductive parts 18, so that these conductive parts and the adhesive material 28, together, form a smooth surface. Then, an additional bonding layer in the form of a thin film may be laminated onto the smooth surface before the circuit board layers 10 are bonded together.

If the layers 10 are formed with a conductive pattern 16 only on one side, e.g. only on the respective top side, an additional bonding layer may also be dispensed with. Then, the bonding layer would be formed only by the adhesive material 28 in the gaps 20 and would be interrupted by the conductive parts 13.

Another example of a method according to the invention will now be described in conjunction with FIGS. 7 to 10. The first steps of this method correspond to the steps that have been described above in conjunction with FIGS. 2 to 5.

Figure 7:
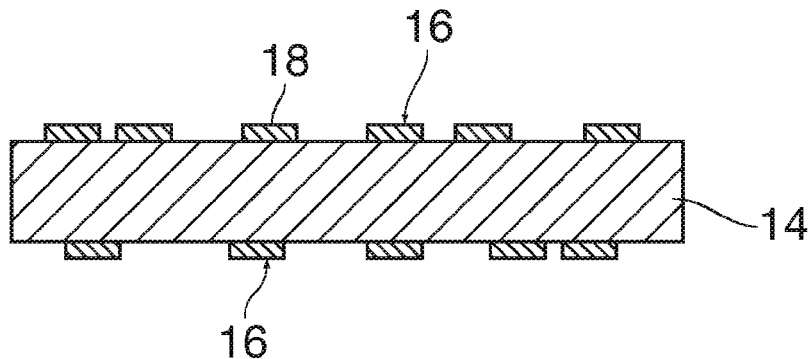
FIGS. 7 to 10 are sectional view illustrating steps of a method according to a modified embodiment.

FIG. 7 illustrates a state where the resist 26 has been stripped off, leaving only the substrate 14 with the conductive patterns 16 formed thereon.

Figure 8:
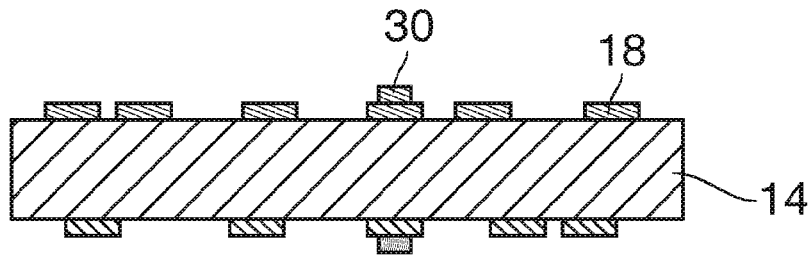

In this example, it shall be assumed that the conductive patterns 16 of two adjacent circuit board layers 10 are to be contacted with one another at specified positions. For this reason, as is shown in FIG. 8, electrically conductive bumps 30 are printed onto the top surface of some of the conductive parts 18, e.g. by means of an ink jet printer.

As an alternative, the bumps 30 may be formed by cover the part of the conductive layer where the interconnection should be made by printing a resist on it, then etching away the top part of the uncovered conductive tracks, leaving a minimum needed thickness of material for the conductive parts 18. In order to prevent under-etching and undesired change of width of the conductive parts 18, the gaps 20 between the tracks should be filled, prior to etching process, with resist to the minimum height that should remain. Next the resist is removed and all gaps are filled with adhesive material until the top surfaces of the bumps are flush with the top surface of the adhesive material.

Figure 9:
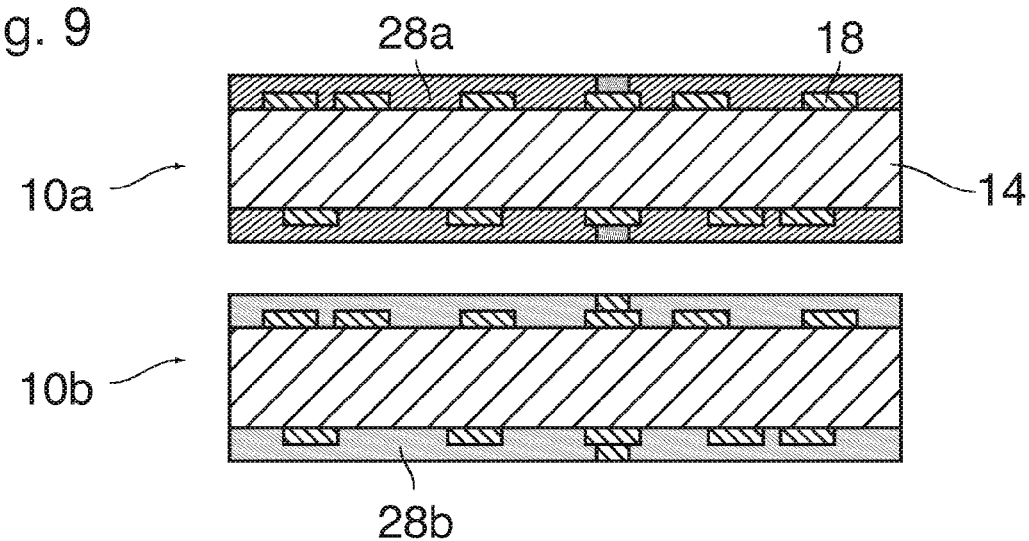
Figure 10:
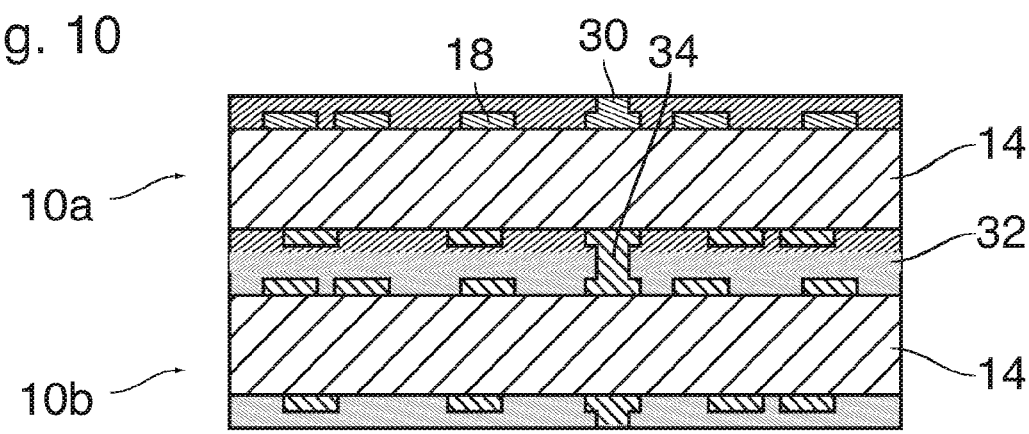

In a subsequent step, illustrated in FIG. 9, the gaps between the conductive parts 18 are filled with a first adhesive material 28a, and the conductive parts 13 are covered by the same adhesive material 28a up to a level that corresponds to the combined thickness of the conductive parts 13 and the bumps 30, so that the top surfaces of the bumps are flush with the top surface of the adhesive material 28a. In this way, first layer 10a of the multi-layer printed circuit board is completed.

According to another method for forming the bumps 30 and achieving the condition shown in FIG. 9, the complete surface of the printed circuit board is covered with an adhesive layer, but holes are left in the adhesive layer in the places where the bumps 30 shall be formed. The next step is to fill the holes with solder and/or grow conductive material via electrochemical processes until the holes are filled to the rim with conductive material.

FIG. 9 further shows another layer 10b that is to be bonded together with the layer 10a. The layer 10b is prepared in the same way as the layer 10a with the only difference that a different adhesive material 28b is used for filling the gaps 20 and covering the conductive parts 18. The adhesive materials 28a and 28b are selected to form reaction partners of a two-component adhesive. Thus, when the layers 10a und 10b are bonded together, as has been shown in FIG. 10, a bonding layer 32 is formed at the boundary between the two layers 10a and 10b due to chemical reaction of the materials 28a and 28b with one another. Further, due to the heat and pressure applied in the bonding step, the bumps 30 are fused with the conductive parts 18 on which they have been formed and with the bumps and conductive parts of the adjacent layer, so that a through-contact 34 is formed for electrically connecting the circuit patterns of the two layers.

Of course, a multi-layer printed circuit board with more than two layers can be formed by stacking alternating layers 10a and 10b and bonding them all together, with formation of bonding layers 32 at the boundary of each pair of adjacent circuit board layers. The bumps 30 that are exposed in the top surface and the bottom surface of the multi-layer board may be used for contacting the circuit patterns. Of course, if desired, the insulating adhesive materials on the top surface of the topmost substrate 14 and the bottom surface of the lowermost substrate 14 may be omitted or may be used just for filling the gaps 20 between the conductive parts, so that, for example, electronic components may be surface-mounted on these circuit patterns.

The resist 26 and the adhesive materials 28, 28a, 28b may be selected from a large variety of suitable materials. Some general features of preferred materials are described below.

The resist 26 that is used for masking the conductive material 16' should have a good adhesion to the surface of the conductive material 16' (e.g. copper) or to the treated surface 24. It is therefore preferred that this resist comprises one or more adhesive substances (including reactive adhesive substances) such as acrylics (including light-curable acrylics) epoxy resins, urethane acrylics, cyano-acrylates or a combination of these components. The material may be selected to have a good instantaneous (intrinsic) adhesion, or adhesion may be induced by heat and/or light treatment or by a chemical reaction of one or more components in the resist or by a reaction of resist ingredients with components on the (treated) copper surface. Typically, the adhesive components should comprise more than 50% (by volume or by weight) of the total material of the resist.

The adhesive materials 28, 28a and 28b that are used for filling the gaps between the conductive parts should have a good adhesion to the surface of the substrate 14 and also to the resist 26, if the adhesive material is to cover the resist, Therefore, this material should also contain one or more adhesive substances (including reactive substances), such as acrylics (including light-curable acrylics), epoxy resins, urethane acrylics, cyano-acrylates or a combination of these components. As with the resist 26, these adhesive components may have a good intrinsic adhesion, or adhesion may be induced or improved by a heat and/or light treatment or by a chemical reaction of one or more components in the material or by a reaction of ingredients with components on the surface of the substrate 14 and/or components of the resist 26. Again, the content of adhesive components in the material 28, 28a or 28b should be more than 50% (by weight or by volume) of the total material.

Depending upon the method with which the resist 26 and the adhesive material 28, 28a, 28b are applied, it may be useful to add additional ingredients to the material. For example, when ink jet technology is used for applying the material, suitable additives would be: a solvent or a diluent (reactive or not) for adjusting the viscosity of the liquid base material as required for ink jet printing; stabilizers and/or inhibitors for preventing premature reaction of the components of the material; flow control and/or gelling agents ensuring a desired flow of the material on the surface onto which they are printed, for regulating coagulation, spread and feathering of the droplets; surfactants for ensuring proper droplet formation and minimizing the creation of satellite droplets; and dyes or pigments for giving the layer a specific colour.

In case of electrostatic printing, suitable additives would be: resins (reactive or not) for making the material solid under normal printing conditions, so as to form toner particles of the required size and suitable for development on a charge image; charge control agents or surface coating agents for regulating the electrical charge of the toner particles so that the toner image can be developed in accordance with the requirements for electrophotographic printing; conductive components or surface coatings for regulating the electrical charge of the toner particles (of course, charge control agents and conductive components should be added only in an amount small enough to assure that the resulting layer will be electrically insulating as a whole); magnetic components; dyes or pigments.

The invention claimed is:

1. A multi-layer printed circuit board comprising:
a plurality of circuit board layers that are bonded together, each of the plurality of circuit board layers including a substrate and a conductive circuit pattern on at least one surface of the substrate,
wherein the circuit pattern comprises conductive parts that are separated by gaps, wherein a bonding layer is provided between each pair of adjacent circuit board layers, and wherein the gaps between the conductive parts are filled with an electrically insulating adhesive material that forms the bonding layer or merges with the bonding layer, so that the bonding layer and the material filling the gaps form a one-piece body, and wherein the one-piece body includes an etch resist material that covers at least a part of the conductive parts and is chemically compatible with the adhesive material.

2. The circuit board according to claim 1, wherein the adhesive material is identical with the etch resist material.

3. A method of manufacturing a multi-layer printed circuit board by bonding together a plurality of circuit board layers, each of the plurality of circuit board layers including a substrate and a conductive circuit pattern on at least one surface of the substrate, the method comprising the steps of:
coating the surface of the substrate with a continuous layer of conductive material;
masking the layer with a resist;
etching away a part of the conductive material so as to obtain the circuit pattern with conductive parts separated by gaps; and
filling the gaps with an electrically insulating adhesive material to a level that is at least equal to a thickness of the layer of conductive material,
wherein the resist is left on the conductive parts and the adhesive material is selected to be chemically compatible with the resist.

4. The method according to claim 3, wherein the adhesive material is identical with the material of the resist.

5. The method according to claim 3, wherein, in the step of filling the adhesive material into the gaps, the same adhesive material is also applied onto the conductive parts and/or onto the resist that has been left thereon.

6. The method according to claim 3, wherein, for each pair of adjacent circuit board layers, a first adhesive material to be filled into the gaps of a first one of the circuit board layers and a second adhesive material to be filled into the gaps of the second one of the circuit board layers are selected to form components of a multi-component adhesive system that chemically react with one another in the bonding process.

7. The method according to claim 3, wherein ink jet printing is used for applying the adhesive material.

8. The method according to claim 7, wherein the adhesive material is applied in several layers in subsequent ink jet printing steps, at least in the areas of the gaps.

9. The method according to claim 3, wherein an electrophotographic printing technique is used for applying the adhesive material.

10. The method according to claim 3, comprising a step of forming local conductive bumps on the surface of the conductive pattern, wherein the gaps are filled with the adhesive material to the level of the top surfaces of the bumps.

* * * * *